United States Patent
Nielsen

(10) Patent No.: US 8,253,039 B2
(45) Date of Patent: Aug. 28, 2012

(54) ASSEMBLY COMPRISING AN ELECTROMAGNETICALLY SCREENED SMD COMPONENT, METHOD AND USE

(75) Inventor: Christian Nielsen, Smørum (DK)

(73) Assignee: Oticon A/S, Smørum (DK)

( * ) Notice: Subject to any disclaimer, the term of this patent is extended or adjusted under 35 U.S.C. 154(b) by 827 days.

(21) Appl. No.: 12/238,565

(22) Filed: Sep. 26, 2008

(65) Prior Publication Data
US 2009/0084586 A1 Apr. 2, 2009

(30) Foreign Application Priority Data
Sep. 27, 2007 (EP) .................................. 07117363

(51) Int. Cl.
*H05K 9/00* (2006.01)
(52) U.S. Cl. ...................... 174/386; 174/384; 361/816
(58) Field of Classification Search ................ 174/377, 174/382, 384, 386; 361/816
See application file for complete search history.

(56) References Cited

U.S. PATENT DOCUMENTS

| | | | |
|---|---|---|---|
| 5,151,770 A | 9/1992 | Inoue | |
| 5,355,016 A * | 10/1994 | Swirbel et al. | 257/659 |
| 5,639,989 A | 6/1997 | Higgins, III | |
| 6,031,923 A | 2/2000 | Gnecco et al. | |
| 6,566,596 B1 | 5/2003 | Askew | |
| 7,003,127 B1 | 2/2006 | Sjursen et al. | |
| 7,180,012 B2 * | 2/2007 | Tsuneoka et al. | 174/521 |
| 7,187,060 B2 * | 3/2007 | Usui | 257/659 |
| 2001/0033478 A1 | 10/2001 | Ortiz et al. | |
| 2001/0054754 A1 | 12/2001 | Inoue | |
| 2002/0028530 A1 | 3/2002 | Kawanishi | |
| 2005/0162841 A1 | 7/2005 | Ogatsu | |
| 2006/0266547 A1 | 11/2006 | Koga | |
| 2007/0201715 A1 | 8/2007 | Minervini | |

FOREIGN PATENT DOCUMENTS
WO WO 03/015487 A1 2/2003

OTHER PUBLICATIONS
European Search Report dated Mar. 19, 2008.

* cited by examiner

*Primary Examiner* — Hung Ngo
(74) *Attorney, Agent, or Firm* — Buchanan, Ingersoll & Rooney PC

(57) ABSTRACT

The disclosure relates to an electronic component assembly including at least one SMD component (11) having a number of external surfaces (111) limited by edges (112) and at least two electrical terminals (113), an electromagnetic screen (12) for limiting the electromagnetic coupling to and from the SMD component or components, and an electrically insulating layer (13) located between at least one of the surfaces and the electromagnetic screen. The disclosure furthermore relates to a method of manufacturing an electronic component assembly and to the use of an electronic component assembly.

25 Claims, 8 Drawing Sheets

ASSEMBLY COMPRISING AN ELECTROMAGNETICALLY SCREENED SMD COMPONENT, METHOD AND USE

TECHNICAL FIELD

The present disclosure relates to surface mount components in instruments (e.g. hearing instruments), where e.g. analogue, digital and wireless technology must coexist in very densely packed units.

The disclosure relates specifically to an electronic component assembly comprising at least one surface mount component (SMC) and an electromagnetic screen for limiting the electromagnetic coupling to and from the surface mount component(s) and an electrically insulating layer located between at least one surface of the surface mount component(s) and the electromagnetic screen. The disclosure further relates to an intermediate product comprising an electronic component assembly.

The disclosure furthermore relates to a method of manufacturing an electronic component assembly, to a method of selectively protecting one or more electronic SMD components from electromagnetic coupling to one or more other electronic components without an electromagnetic screen and to the use of an electronic component assembly.

The disclosure may e.g. be useful in an instrument or device where a general electromagnetic screen is not attractive or possible due to volume-restrictions (such as in a hearing instruments) and/or where there is a need to screen some components (e.g. radio components) from other neighbouring components (e.g. a digital processor).

BACKGROUND ART

The following account of the related art relates to one of the areas of application of the present disclosure, hearing instruments (also termed hearing aids (HA) in the present application).

Many electronic devices incorporate printed circuit boards (PCB) whereon electronic components are mounted directly onto one or both sides using a Surface Mount Technology (SMT) (as opposed to mounting technologies e.g. involving pins extending through holes in the PCB). Components that are specifically adapted for being surface mounted are typically physically smaller than corresponding components with pins. The use of surface mount components is in general an advantage where relatively small dimensions and a relatively high degree of automation in the mounting process is an advantage. Electronic components adapted for being surface mount are sometimes referred to as SMC (Surface Mount Components) but also as SMD (Surface Mount Device) components. The latter term will be used in the present application. An SMD component has electrical terminals in the form of metallised areas (e.g. in the form of end caps) suitable for being soldered (typically by a machine) directly onto solderable electrically conducting pads ('footprints') on the surface of a substrate provided with solder paste for receiving a particular SMD component (the substrate, e.g. a PCB, typically having predefined electrically conducting patterns for interconnecting the various SMD components on the substrate and possibly for connecting the circuitry to external parts). The terminals on an SMD component, in the meaning used in the present application, are generally 'naked' (i.e. not protected by any screening arrangement), so the signals they carry exposed to or carry may be picked up (by the component itself or by neighbouring components) in an unintended way. In hearing instruments analogue, digital and wireless technology must coexist in very densely packed, battery powered, units, e.g. in the form of a number of closely spaced, possibly electrically connected, different electronic components (including SMD components) assembled on a substrate (possibly on both sides) and housed in the same housing with spatial dimensions of the order of mm's or tens of mm's in a given spatial direction. Electromagnetic coupling between different circuits is thus very likely, especially when high impedance circuits are used. In hearing instruments the impedance level is generally very high in order to save power.

US 2001/0033478 describes a scheme for shielding a printed circuit board (PCB) including a vacuum deposited metal layer for shielding electronic components on a PCB. The metal layer can be disposed on an encapsulating insulating layer and grounded to a ground trace on the PCB.

US 2006/266547 describes a metallic film and a grounding pattern connected to each other so as to achieve electrical shield of an electronic circuit unit. The metallic film is provided on a top surface of a sealing resin portion for burying an electronic component, the side surfaces of the sealing resin portion that are opposite to each other, and the side surfaces of the multi-layered substrate that are opposite to each other. Since the metallic film is formed on the side surfaces of the sealing resin and the side surfaces of the multi-layered substrate, when the metallic film is formed by a plating method, the blind hole may not be provided in the related art.

U.S. Pat. No. 5,639,989 describes electronic components which are shielded from electromagnetic interference (EMI) by one or more conformal layers. Shielding is accomplished through the use of a single general purpose shielding layer, or through a series of shielding layers for protecting more specific EMI frequencies. In a multilayer embodiment, a semiconductor device is mounted on a printed circuit board substrate (16) as a portion of an electronic component assembly. A conformal insulating coating is applied over the device to provide electrical insulation of signal paths (e.g. leads and conductive traces) from subsequently deposited conductive shielding layers. One or more shielding layers are deposited, and are in electrical contact with a ground ring.

U.S. Pat. No. 6,566,596 describes magnetic or electric shielding, or both integrated into the chip packaging materials. A nonconductive primary and tertiary layer sandwich a high-conductivity metal secondary layer forming a Faraday cage for electric field shielding. A nonconductive primary layer is covered by a tertiary layer formed of a composite having permeable material for magnetic shielding. The tertiary layer formed of a composite could include a high permeability particulate ferrous material. Both the secondary layer and the tertiary layer formed of a composite could be used for both electric and magnetic shielding of chips.

SUMMARY AND OBJECTS

The disclosure relates to SMD components, in particular to a combination of an electromagnetic shield covering (optionally being electrically connected to) one or more SMD components. The SMD components can be any single or combination of capacitors, resistors and inductors or integrated, analogue or digital circuits that are packed in a common package (adapted for being surface mounted on a substrate) with a common electromagnetic shield. The device resulting from the arrangement of a common electromagnetic screen applied to one or more SMD components is in the present context termed an 'electronic component assembly'. The electronic component assembly according to the disclosure appears as one item, which can be handled as an SMD component e.g. in terms of mounting on a substrate.

An object of the present disclosure is to provide an electronic component assembly that is suitable for integration on a substrate in a mixed analogue digital environment. It is an object of the disclosure to provide a component assembly that can shield a predefined group of SMD components against electromagnetic radiation at radio frequencies (RF). It is an object of the disclosure to provide a component assembly that can shield a predefined group of SMD components against static and relatively low frequency electric fields. It is an object of the disclosure to provide a component assembly that can shield a predefined group of SMD components against static and relatively high frequency electric fields.

Objects of the disclosure are achieved by the disclosure described in the accompanying claims and as described in the following.

An object of the disclosure is achieved by an electronic component assembly comprising at least one SMD component comprising
a number of external surfaces limited by edges and
at least two electrical terminals,
an electromagnetic screen for reducing or limiting the electromagnetic coupling to and from the SMD component or components,
an electrically insulating layer located between at least one of the surfaces and the electromagnetic screen, An advantage of the disclosure is that a predefined arrangement of SMD components, e.g. a single SMD component or a group of SMD components, can be independently shielded to allow for an increased density of components on a substrate. Critical input components, such as RF-receiver and sensitive analogue circuits in general, that are located near a source of electromagnetic radiation (e.g. clock generator and digital circuits in general) can be advantageously arranged in a component assembly according to the disclosure, whereas uncritical components or components located farther away from the source of electromagnetic radiation can be left unshielded, having the advantage that no post-shielding-process is needed after the (shielded) component assembly or assemblies and (un-shielded) components have been mounted on their common substrate, e.g. a PCB. Also groups of components, which are sources of electromagnetic radiation, and therefore can disturb other circuits, can be individually arranged as electronic component assemblies according to the disclosure, and thereby have their electromagnetic radiation reduced. This has the advantage of allowing them to be located relatively closer to other circuits on a substrate than would otherwise be practically possible (while the total arrangement of components and circuits are still being functional).

The term 'external surface' in relation to an SMD component, is in the present context taken to mean a face of the component that limits its spatial extent, i.e. an outer face (cf. e.g. 111 in FIG. 3), of the component that is limited by one or more edges (cf. e.g. 112 in FIG. 3), an edge being common with, typically, one other external surface of the component. Typically, an SMD component is a substantially box-formed body (cf. e.g. 11 in FIG. 3) comprising substantially planar, substantially rectangular external surfaces and a number of electrical terminals (cf. e.g. 113 in FIG. 3), the terminals being adapted for being electrically connected to a substrate (e.g. by soldering). Preferably, the electrical terminals (which are intended to be electrically connected to the substrate) are accessible on at least one common surface of the SMD component (cf. e.g. 111' in FIG. 3b).

The term 'electromagnetic screen' is in the present context taken to mean a structure that is adapted to screen another body from electromagnetic fields, i.e. which is essentially non-penetrable for electromagnetic fields (in a relevant frequency range) or which attenuates the electromagnetic field substantially (e.g. more than 20 dB). The attenuation of the electromagnetic field of given layer of material depends on several parameters, including the frequency and strength of the field, material parameters such as the electrical resistance, the magnetic permeability, the thickness, the size of possible openings in the material, etc. In an embodiment, the electromagnetic screen is mainly aimed at screening electric fields. This can e.g. be achieved by a relatively open, e.g. mesh- or web-structure of a metallic material. In an embodiment, the electromagnetic screen is aimed at screening electric fields. This can e.g. be achieved by a continuous layer or a web of a material having a relatively high electric conductivity (low electrical resistance) and a certain thickness depending on the relevant field strengths.

The electromagnetic screen is preferably made of a material, which is solderable or in another way adapted to be electrically connectable to a terminal of an SMD component and possibly to an electrical connection on a substrate. Preferably, the substrate comprises a reference ground plane to which the electromagnetic screen can be electrically connected.

The term 'electrically insulating' is in the present context taken to mean being essentially electrically non-conducting. For example, an electrically insulating material can be a material having a specific electrical resistance larger than $10^{10}$ $\Omega \cdot m$. Examples of an electrically insulating material for use in the present context are e.g. polyethylene (PE) or polyvinyl chloride (PVC).

The term 'electrical terminal' is in the present context taken to mean an area or a part of a component comprising an electrically conductive material which allows an electrical connection to be made to another component or system and which provides electrical access to (a specific part of) the component.

The term 'reducing the electromagnetic coupling' is in the present text taken to mean that the electromagnetic field is redirected by the electromagnetic screen and thus prevents a part of the field to reach the component being screened.

The term 'a surface that is adapted to be electrically connected to a substrate' is in the present context taken to mean that at least one electrical terminal of the component is connectable to a substrate from that surface and that the surface is compatible with the surface of the substrate (e.g. in form). A substrate is in this context intended to constitute a supporting structure for electrical connections between two or more electronic components or component assemblies. Such a substrate can e.g. take the form of a rigid or flexible printed circuit board (PCB) or a ceramic substrate.

In an embodiment, the electrically insulating layer is applied (directly) to one or more external surfaces of the SMD component or components. Alternatively, one or more other solid layers or fluid materials (e.g. air) may be located between the surface and the electrically insulating layer. In an embodiment, an electrically insulating layer may be constituted by a fluid layer, e.g. of air. In an embodiment, the electrically insulating layer is constituted by a mixture of a solid and a fluid material, so that some parts of an external surface of an SMD component are covered by a solid material while other parts are covered by a fluid material (e.g. air, so that the space between such surface areas and an electromagnetic screen is air-filled, e.g. so that the fluid electrically insulating material is enclosed between the electromagnetic screen and a solid electrically insulating material covering (relevant) parts of the SMD-surfaces).

In an embodiment, the electrically insulating layer and the electromagnetic screen cover at least a part of more than one surface of an SMD, such as more than two, three, four or five surfaces.

In an embodiment, the at least one SMD component has a substrate-facing surface that is adapted for facing a substrate for electrical connection of a terminal of the component to the substrate. In an embodiment, the electrically insulating layer and the electromagnetic screen cover at least a part of some of the surfaces of the SMD component, such as all but the substrate-facing surface. Optionally, the electrically insulating layer and the electromagnetic screen cover (at least) a major part of the area of all but the substrate-facing surface. This has the advantage of maximizing the screening effect of the electromagnetic screen for components of the assembly in directions away from the substrate on which the component assembly is intended for being mounted. In an embodiment, the electrically insulating layer and optionally also the electromagnetic screen cover a part of the substrate-facing surface (e.g. such parts which does not contain electrical terminals).

In an embodiment, the electromagnetic screen is electrically connected to a separate electrical terminal of the SMD component, the terminal being dedicated to this purpose and for being connected to an electrically conducting area (e.g. a pad) on a substrate.

In an embodiment, the electromagnetic screen is electrically connected to at least one of the electrical terminals of the SMD component.

In an embodiment, the electromagnetic screen is soldered to (or adapted to be soldered to) an electrical terminal of the SMD component or components. Alternatively, the electromagnetic screen may be connected to the electrical terminal of the SMD component by any other appropriate means, e.g. by physical contact ('butt-coupling'), by an electrically conducting adhesive, by welding, etc.

In an embodiment, the electronic component assembly contains only one SMD component. In an embodiment, the SMD component is a two-terminal component, e.g. a capacitor or a resistor. In an embodiment, the electrical insulator and the electromagnetic screen are integral with the one SMD-component, to ensure that the component assembly can be handled as one item (e.g. when mounted on a substrate). In an embodiment comprising only one capacitor SMD component, the electromagnetic screen is connected to a terminal of the capacitor, thereby providing an asymmetric capacitor assembly component. In an embodiment, the electronic component assembly contains a two-terminal SMD component (e.g. a resistor, a capacitor or an inductor) and additionally a third electrical terminal (not electrically connected to any of the two electrical terminals of the SMD component) to which the electromagnetic screen is electrically connected. In an embodiment, the SMD component is a three-terminal component, e.g. a transistor.

In an embodiment, the electronic component assembly comprises first and second SMD components wherein at least one terminal on the first SMD-component is electrically connected to a terminal on the second SMD-component. In an embodiment, two adjacent electrical terminals of two different SMD components of the electronic component assembly are electrically connected. In an embodiment, the adjacent electrically connected electrical terminals are electrically connected to the electromagnetic screen.

In an embodiment, the electromagnetic screen is adapted to be ONLY connected to the substrate via its electrical connection to one or more electrical terminals of the SMD components of the assembly. In an embodiment, the electromagnetic screen is adapted to be connected to the substrate ONLY via one or more separate electrical connections (i.e. NOT via any of the electrical terminals of the SMD components of the assembly). In an embodiment, the separate electrical connection of the electromagnetic screen to the substrate is made by a substantially continuous joint or by a segmented joint comprising regularly or irregularly spaced separate electrical connections along the periphery if the substrate-screen interface (e.g. on a separate ground plane of the substrate).

In an embodiment, at least one of the one or more SMD-components is a capacitor or a resistor or an inductor or an integrated circuit, such as a processing unit.

In an embodiment, at least one (such as a majority or all) of the one or more SMD-components of the assembly has an elongate, box-formed outer shape defining a longitudinal direction. In an embodiment, electrical terminals of the SMD-components are located at each end of the longitudinal direction (cf. e.g. FIG. 3).

In an embodiment, the electronic component assembly contains two SMD-components having three electrical terminals, one being common between the two SMD. Examples of two-component assemblies could be two capacitors, a capacitor and an inductor, two inductors, two resistors, etc.

In an aspect, a further electronic component assembly is provided, the assembly comprising
  at least one SMD component comprising
    a number of external surfaces limited by edges and
    at least two electrical terminals,
  an electromagnetic screen for limiting the electromagnetic coupling to and from the SMD component or components,
  an electrically insulating layer located between at least one of the surfaces and the electromagnetic screen,
the electronic component assembly constituting one physical item adapted for being handled as an SMD component in terms of mounting on a substrate, while NOT comprising such substrate.

It is intended that the structural features of the electronic component assembly described above, in the detailed description of 'mode(s) for carrying out the disclosure' and in the claims can be combined with the further electronic component assembly. Embodiments of the further electronic component assembly have the same advantages as the corresponding electronic component assembly.

In a further aspect, an intermediate product comprising a component assembly as described above, in the detailed description or in the claims and a substrate whereon the component assembly is mounted is provided. In an embodiment, the substrate comprises electric connections between the component assembly and at least one other electronic component or component assembly. In an embodiment, the substrate is a PCB or a ceramic substrate. In an embodiment, the electromagnetic screen is NOT electrically connected to the substrate, except via a terminal or terminals of the assembly, which it is connected to. This is e.g. relevant (sufficient) in low-frequency applications (e.g. with single-ended signals) at frequencies below 1 MHz. In an embodiment, the electromagnetic screen is adapted to be connected to the substrate via separate electrical connections (optionally in addition to an electrical connection to the substrate (e.g. a ground reference) via an electrical connection to one or more electrical terminals of the SMD components of the assembly). This is e.g. especially relevant for applications involving relatively higher frequencies (e.g. in the range from 1 MHz to 10 GHz) and/or relatively more sensitive components or circuits and/or relatively larger field strengths. In a particular embodiment, the substrate comprises a separate ground reference plane to which the electromagnetic screen is electrically connected.

In a further aspect of the disclosure, use of an electronic component assembly or an intermediate product as described above, in the detailed description or in the claims is provided. In a particular embodiment, use in a listening device, e.g. a hearing aid, or in a portable communications device, e.g. a mobile telephone, is provided.

In a particular embodiment, use for selectively protecting one or more components from electromagnetic coupling to one or more other electronic components not having an electromagnetic screen is provided.

Use in a device to separate computer technology (e.g. a digital signal processor) and wireless technology (e.g. a Blue-Tooth or FM receiver and/or transmitter, etc.).

Use in a device to control the electromagnetic coupling between separate parts comprising different analogue signals or between a part comprising analogue circuitry and a part comprising digital circuits.

In a particular embodiment, the assembly is used in an application at frequencies lower than 30 MHz, such as lower than 10 MHz, such as lower than 1 MHz.

In a further aspect of the disclosure, a method of manufacturing an electronic component assembly is provided, the method comprising
  Providing a SMD component;
  Providing a first mask layer for screening areas of a surface of the component intended for not being covered by an electrically insulating layer;
  Applying a layer of an electrically insulating material to the SMD component;
  Removing the first mask layer (thereby removing electrically insulating material applied to the mask layer);
  Providing a second mask layer for screening areas of a surface of the component or applied electrically insulating layer intended for not being covered by an electrically conductive layer;
  Applying a layer of an electrically conductive material;
  Removing the first mask layer (thereby removing electrically conductive material applied to the mask layer);
  Optionally applying a further electrically insulating layer at least to parts of the electrically conductive layer (possibly applying a third mask layer prior thereto);

In a further aspect of the disclosure, a method of manufacturing an electronic component assembly is provided, the method comprising
  Providing a SMD component;
  Providing a first mask layer for screening areas of a surface of the component intended for facing a mounting substrate that are intended for being electrically connected to the mounting substrate;
  Applying a layer of an electrically insulating material to the SMD component;
  Applying a layer of an electrically conductive material to the electrically insulating material;
  Removing the first mask layer (thereby removing electrically insulating and conductive material applied to the mask layer);
  Optionally applying a further electrically insulating layer at least to parts of the electrically conductive layer (possibly applying a second mask layer prior thereto);

In an embodiment, the electronic component assembly contains only one SMD component. In an embodiment, the SMD component is a two-terminal component, e.g. a capacitor or a resistor. In an embodiment, the two-electrical terminals of the SMD component are provided as end caps on a rectangular box formed body enclosing the electrical component in question.

In an embodiment, the electrically conductive layer comprises Cu, Al, Cr, Ni or Ag or alloys thereof.

In an embodiment, the thickness of the electrically conductive layer is larger than or equal to 1 µm, such as larger than or equal to 5 µm, such as larger than or equal to 10 µm, such as larger than or equal to 20 µm. In an embodiment, the thickness of the electrically conductive layer is in the range from 5 µm to 10 µm. In an embodiment, the thickness of the electrically conductive layer is in the range from 1 µm to 30 µm, such as in the range from 10 µm to 20 µm.

In an embodiment, the thickness of the electrically insulating layer is larger than or equal to 5 µm, such as larger than or equal to 10 µm, such as larger than or equal to 20 µm, such as larger than or equal to 30 µm. In an embodiment, the thickness of the electrically insulating layer is in the range from 1 µm to 30 µm, such as in the range from 10 µm to 20 µm.

In an embodiment, the electrically insulating layer is applied by spraying a lacquer with a relatively low dielectric constant $\in_r$ onto the SMD component.

In an embodiment, the electrically conductive layer is provided by vacuum deposition, e.g. Al or Cu or Ag or an alloy thereof.

In an embodiment, the electrically conductive layer is applied by a galvanic method.

In a further aspect of the disclosure, a method of selectively protecting one or more electronic SMD components from electromagnetic coupling to one or more other electronic components without an electromagnetic screen is provided. The method comprises
  Providing said one or more SMD components as one or more electronic component assemblies as described above, in the detailed description or in the claims;
  Providing a substrate adapted for mounting said one or more electronic component assemblies and said one or more other electronic components;
  Optionally providing a footprint comprising electrical interconnections between at least some of said components on said substrate;
  Mounting said one or more electronic component assemblies and said one or more other electronic components on said substrate.

In a further aspect of the disclosure, a portable electronic device, e.g. a listening device, comprising an electronic component assembly as described above, in the detailed description or in the claims is provided. In a particular embodiment, the portable listening device comprises a mobile telephone or a hearing aid or a headset of a pair of headphones. In a particular embodiment, the hearing aid is adapted to communicate wirelessly with another hearing aid and/or with other devices. In an embodiment, the hearing aid is adapted to communicate wirelessly with another hearing aid and/or with other devices via an inductive coupling to the other hearing aid or other device. In an embodiment, the hearing aid is adapted to be located behind the ear (BTE) or in the ear or ear canal (ITE or IEC) or implanted in the body (e.g. in the form of a cochlear implant).

Further objects of the disclosure are achieved by the embodiments defined in the dependent claims and in the detailed description of the disclosure.

As used herein, the singular forms "a," "an," and "the" are intended to include the plural forms as well, unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements maybe present. Furthermore, "connected" or "coupled" as used herein may include wirelessly connected or coupled. As used herein, the term "and/or" includes any and all combinations of one or more of the associated listed items.

BRIEF DESCRIPTION OF DRAWINGS

The invention will be explained more fully below in connection with a preferred embodiment and with reference to the drawings in which.

The figures are schematic and simplified for clarity, and they just show details which are essential to the understanding of the invention, while other details are left out. Throughout, the same reference numerals are used for identical or corresponding parts.

Further scope of applicability of the present disclosure will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

In order to screen SMD components from undesired electromagnetic fields (from neighbouring devices on a common substrate or from a neighbouring substrate in the same device or from another separate device) a screen is put around the surface, preferably on all sides except one. The non-shielded side is preferably the solder side.

The shield may be connected in various ways.

1. Connected to an extra dedicated shield terminal.
2. Connected to an electrical terminal (e.g. at one end) of a component in the assembly.

When the device, which the assembly is part of, e.g. a hearing instrument, includes computer technology (e.g. a digital signal processor) and wireless technology (e.g. a Blue-Tooth or FM receiver and/or transmitter, etc.) at the same time, the use of component assemblies according to the disclosure will facilitate the use of a more sensitive wireless receiver and/or a lower signal level in the transmitter.

Also with respect to analogue signals, the electromagnetic coupling between different parts can be controlled by the use of a component assembly according to the disclosure. Similarly, feedback problems caused by electromagnetic fields can be reduced.

The disclosure is especially useful in an instrument or device where a general electromagnetic screen is not attractive or possible due to volume-restrictions (such as in a HA) and/or where there is a need to screen some components (e.g. radio components) from other neighbouring components (e.g. a digital processor).

Figure 1A:
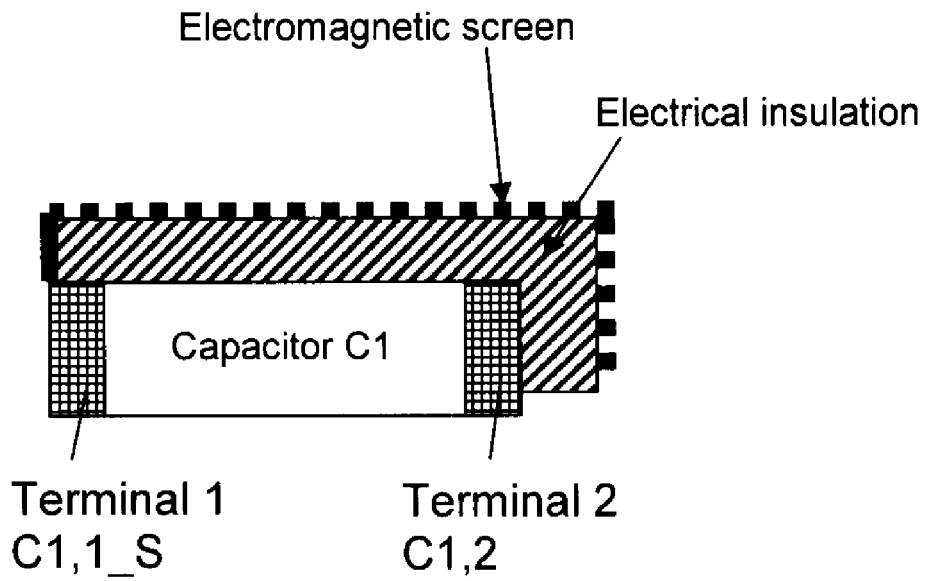
FIG. 1 shows a component assembly according to an embodiment of the invention comprising a single SMD component (FIG. 1a) and two serially connected SMD-components (FIG. 1b) provided with an electromagnetic screen connected to an end terminal of the assembly.
Figure 1B:
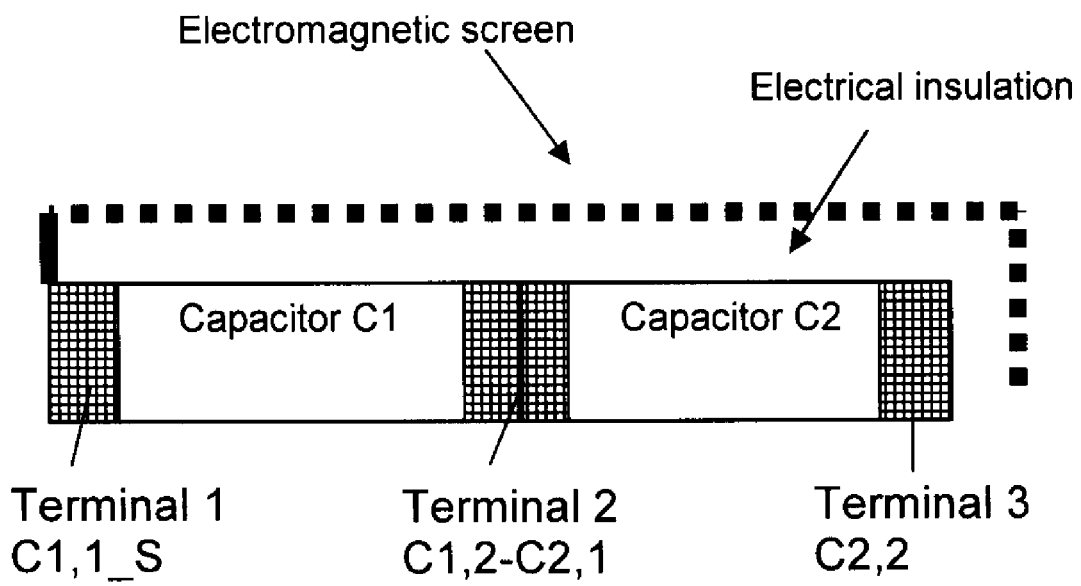

FIG. 1 shows a component assembly according to an embodiment of the invention comprising a single SMD component (FIG. 1a) and two serially connected SMD-components (FIG. 1b) provided with an electromagnetic screen connected to an end terminal of the assembly. Generally the SMD components can be of any kind and shape. In FIG. 1, the component assembly comprises two SMD components, which are shown to be elongate, box-formed capacitors C1, C2 with electrical terminals C1,1, C1,2 and C2,1, C2,2, respectively) in the form of end caps at each end of the components in their longitudinal directions as defined by the outer limitations of the components.

FIG 1a shows a preferred embodiment of the invention, containing a single SMD component (here capacitor C1 with electrical terminals C1,1, and C1,2), the assembly having electrical terminals 1 and 2, where an electrical screen is connected to one of the electrical terminals C1,1 (termed C1,1_S in FIG. 1a) of the capacitor thereby providing an asymmetric component. An electrically insulating material is applied between the electrical screen and the external surfaces of the SMD component (except that neither screen nor insulation is applied to the surface of the component intended for being mounted on a carrier substrate). As indicated in FIG. 1a, the electrically insulating material is slightly withdrawn from the external surface of the SMD component intended to face a mounting substrate (e.g. a PCB) for interconnection to other components or component assemblies. Likewise, the electromagnetic screen layer is slightly withdrawn relative to the external surface of the SMD component intended to face a mounting substrate (here shown to be relatively more withdrawn than the insulating layer; alternatively, the two layers may be equally withdrawn). In general an edge or rim of an electrical screen, which is not intended for being electrically connected to a substrate should be sufficiently withdrawn from the external surface of the SMD component intended to face a mounting substrate to ensure that the screen is not accidentally electrically connected to an electrical connection on the substrate (or on a SMD-component of the assembly) when the component assembly is mounted thereon.

In the embodiment of FIG 1b, two capacitors are electrically connected in series (e.g. by soldering) in that terminal 2 of the assembly is common for terminals C1,2 and C2,1 of capacitor 1 and capacitor 2, respectively. Terminal 1 of the assembly is denoted terminal C1,1_S indicating an electrical connection of terminal C1,1 of capacitor 1 to the electromagnetic screen (S). The electromagnetic screen S is common to the two SMD components and covers at least one surface of each of the SMD components and preferably all external surfaces of the joined SMD components except the 'underside' intended for being mounted on a substrate for electrical connection of the terminals (cf. e.g. FIG. 2). The space between the electromagnetic screen and the surfaces of the SMD components covered by the screen are fully or partially filled with an electrically insulating material, in the form of a fluid, e.g. a liquid or gas, e.g. air, or solid, e.g. a polymer, material, or a combination thereof. An example of a component assembly as shown in FIG. 1b comprising a series connection of two SMD capacitors with a common electromagnetic screen can e.g. be used in a tuned wireless input circuit.

Figure 2A:
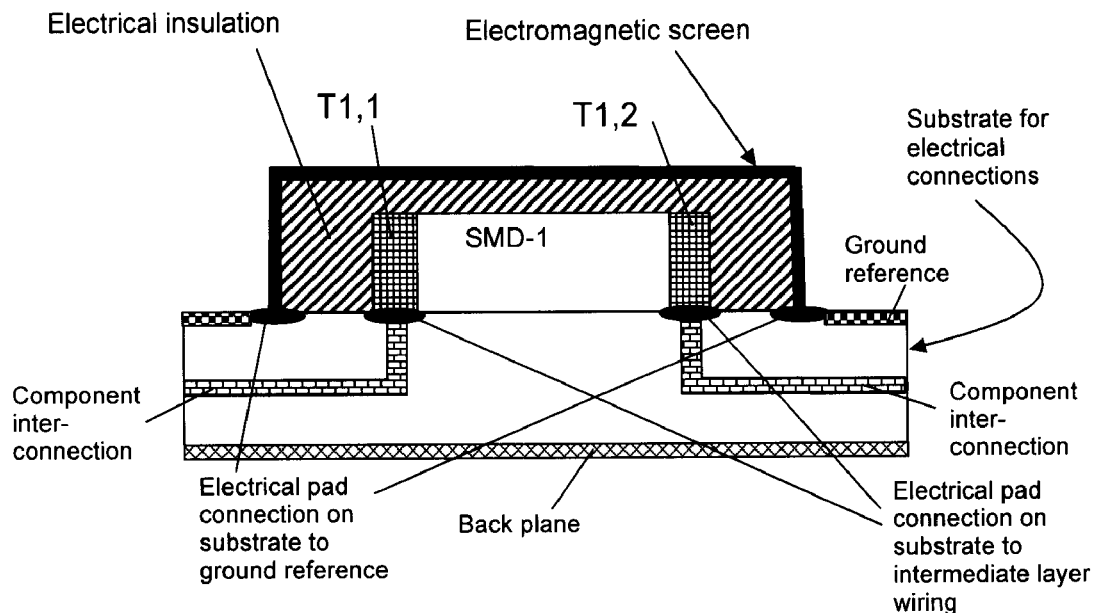
FIG. 2 shows a component assembly according to an embodiment of the invention comprising one SMD-component provided with an electromagnetic screen, the assembly being mounted on a carrier, FIG. 2a illustrating a relatively high-frequency or high sensitivity component application where the screen is connected to a ground reference plane on the substrate via dedicated screen terminals and FIG. 2b a relatively low-frequency or low sensitivity component application where the screen is connected to the substrate via a dedicated middle (screen) terminal of the assembly.
Figure 2B:
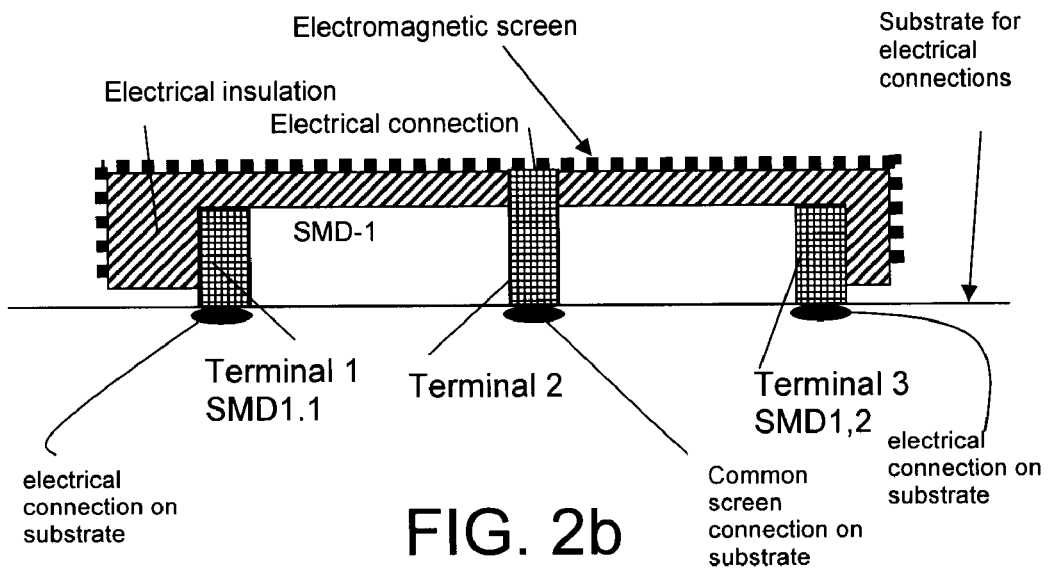

FIG. 2 shows a component assembly according to an embodiment of the invention comprising one SMD-component provided with an electromagnetic screen, the assembly being mounted on a carrier, FIG. 2a illustrating a relatively high-frequency or high sensitivity component application where the screen is connected to a ground reference plane on the substrate via dedicated screen terminals and FIG. 2b a relatively low-frequency or low sensitivity component application where the screen is connected to the substrate via a dedicated middle (screen) terminal of the assembly. The terminals of the component assembly are electrically connected to the substrate, e.g. via solder pads on the substrate which are pre-loaded with solder paste. The component assembly can e.g. be manually placed and fixed to the substrate or alternatively e.g. be positioned on the substrate using a pick and place mounting robot and e.g. be fixed to the substrate by a reflow solder process. In the embodiment shown in FIG. 2a, the outer edges of the electromagnetic screen are electrically connected to a ground reference plane of a multilayer printed circuit board (substrate), e.g. continuously around the 'rim' of the screen along the substrate surface or at one or more distinct points, e.g. with a certain distance between the connecting points or areas. Further, the electromagnetic screen is a relatively high-quality screen (e.g. a continuous, relatively thick layer of a highly conductive metal, e.g. Cu, e.g. having a polished surface for shielding RF radiation). The two electrical terminals (T1,1 and T1,2) of the SMD-component (SMD-1) are indicated to be connected to other components via an intermediate wiring layer (Component interconnection). Several intermediate layers for interconnections may be present. Further, the substrate contains an electrically conductive back plane to which the electromagnetic screen is electrically connected (at various points or around its whole periphery). This embodiment can be used in a relatively high-frequency application (or for highly sensitive components at lower frequencies), e.g. involving frequencies larger than 100 MHz, such as lager than 500 MHz, such as larger than 1 GHz (e.g. involving a wireless communication interface, e.g. an FM or a BlueTooth radio interface). In the embodiment shown in FIG. 2b, the outer edges of the electromagnetic screen are NOT electrically connected to the substrate. The screen is only connected to the substrate via the dedicated Terminal 2 of the assembly located between terminals SMD1,1 and SMD1,2 of the SMD-component SMD-1. The electromagnetic screen is a relatively low-quality screen, e.g. comprising a regular or irregular web-structure or a relatively thin continuous layer of a relatively cheap, metallic material, e.g. iron, possibly having a relatively low electrical conductance, the surface of which may be relatively uneven. This embodiment can be used in a relatively low-frequency application, e.g. involving frequencies below 30 MHz, such as below 10 MHz, such as below 1 MHz. For such applications, only protection against the electrical near field needs to be provided by the electromagnetic screen (due to the small dimensions of the components relative to the wavelength of the EM-signals). This has the advantage of being more economic and simpler in implementation, requiring cheaper screen and substrate materials, less wiring on and connections to the substrate (the electromagnetic screen need for example not be electrically connected to the substrate around its periphery). The SMD components can be of any appropriate kind, e.g. any combination of capacitors, resistors and inductors.

Figure 3A:
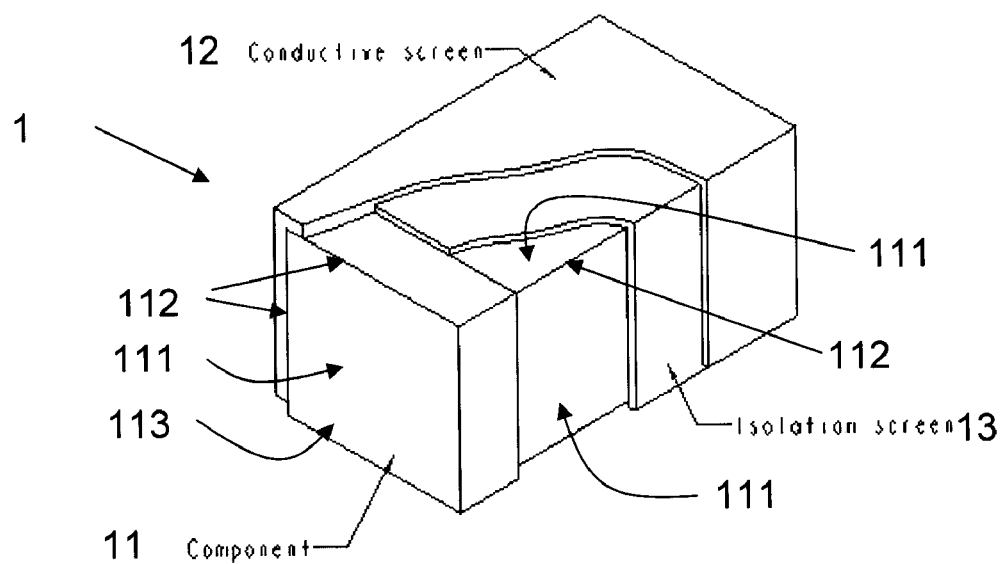
FIG. 3 shows a component assembly according to an embodiment of the invention comprising a single, two terminal SMD component provided with an electromagnetic screen connected to one of the two terminals, FIG. 3a illustrating a perspective view, FIG. 3b showing three different perpendicular cross-sectional views.
Figure 3B:
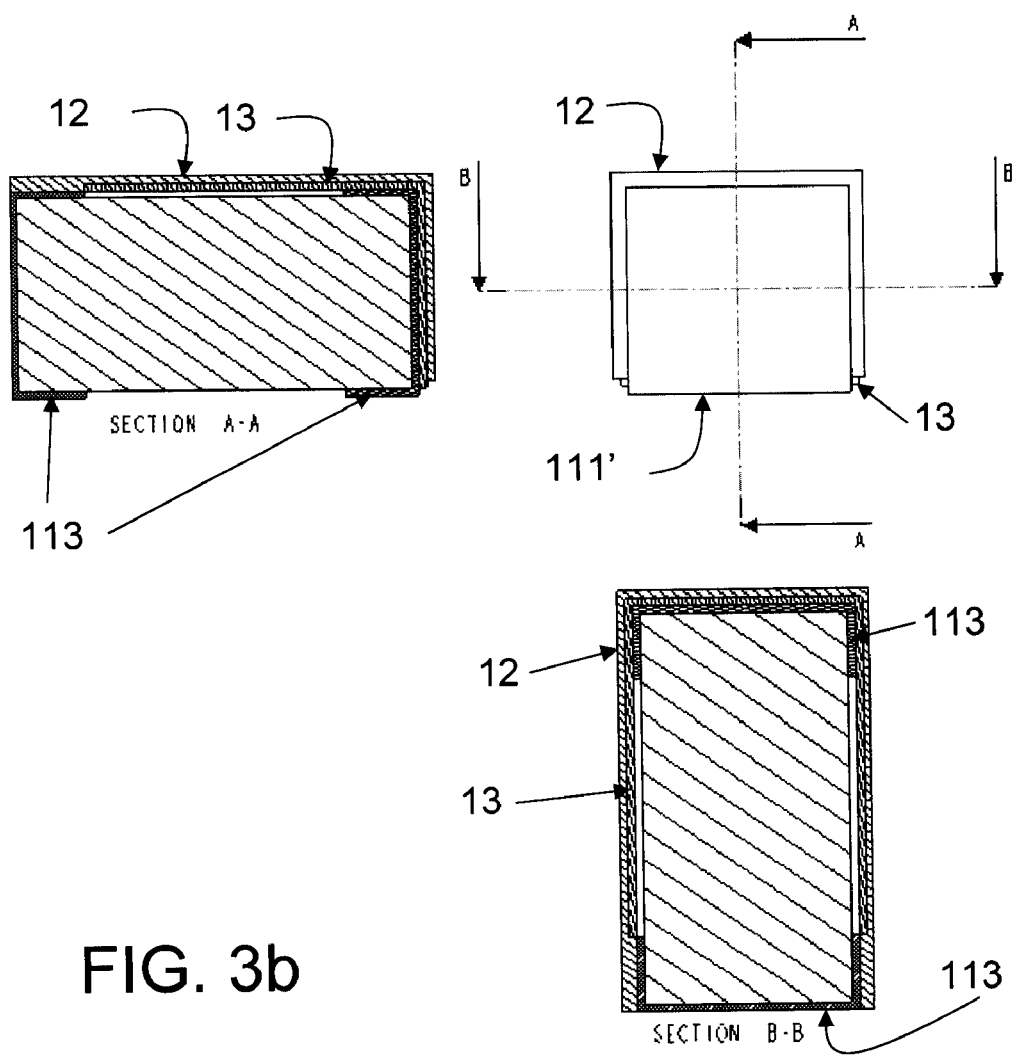

FIG. 3 shows a component assembly according to an embodiment of the invention comprising a single, two terminal SMD component provided with an electromagnetic screen connected to one of the two terminals, FIG. 3a illustrating a perspective view, FIG. 3b showing three different perpendicular cross-sectional views. In FIG. 3b, the top right cross section is an end view of the component as shown in perspective on FIG. 3a, where an end face of the electrical terminal 113, which is electrically connected to the electromagnetic screen 12 of the assembly, is visible. Further, the cross sectional views of the left and bottom parts of FIG. 3b are indicated by lines AA and BB, respectively. The electronic component assembly 1 comprises one box-shaped SMD component 11, having outer surfaces 111 separated by edges 112. The SMD component 11 (e.g. a capacitor, an inductor or a resistor or a circuit comprising a combination thereof) has two (accessible) electrical terminals 11 3. An electrically insulating layer 13 (Isolation screen in FIG. 3a, shown partially cut out for illustrative purposes) is applied the outer surfaces of the SMD component, except to the bottom surface 111' (cf. FIG. 3b) and except to the (left) electrical terminal 113 visible in FIG. 3a. A shielding layer 12 (Conductive screen in FIG. 3a, shown partially cut out for illustrative purposes) of an electromagnetically shielding material, e.g. a good electrical conductor (adapted to the application in question) is applied to the electrically insulating layer 13 AND electrically connected to a terminal 113 of the SMD component.

As indicated in the drawing, the electromagnetic screen 12 is somewhat withdrawn relative to the underlying insulating layer 13 to avoid unintentional electrical connection to a pad of a substrate for connecting to the adjacent electrical terminal, in case this terminal is soldered to the pad. Alternatively, the electromagnetic screen can be covered by an electrically insulating layer (e.g. by applying an electrically insulating coating, e.g. a paint or lacquer), at least around the areas that are close to a substrate when the component assembly is mounted on the substrate.

Figure 4A:
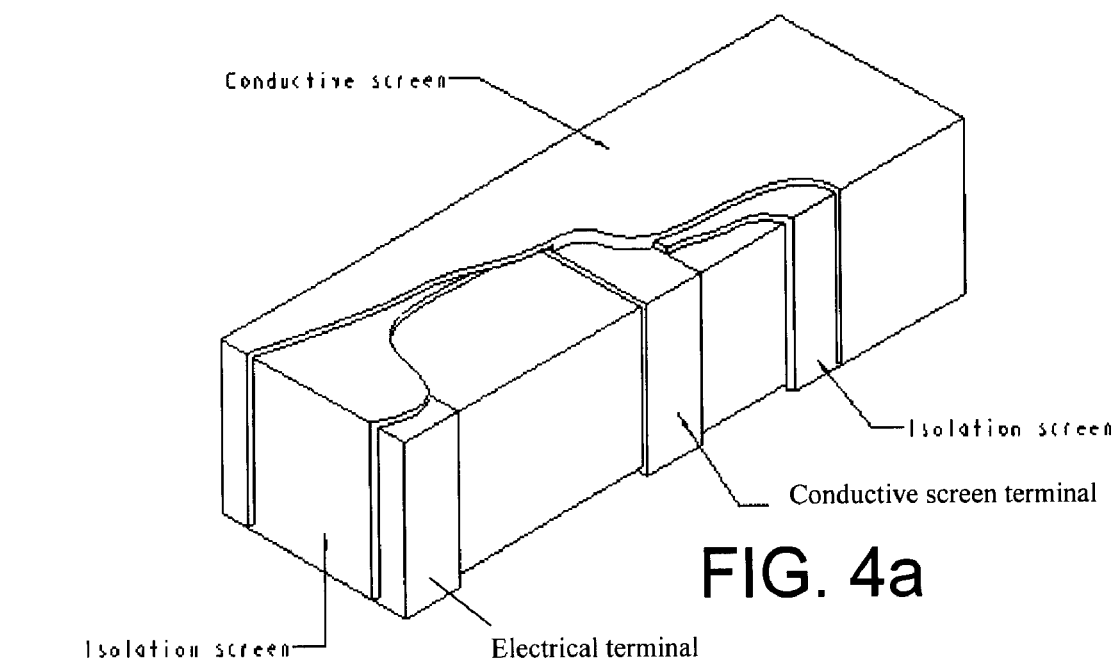
FIG. 4 shows a component assembly according to an embodiment of the invention comprising a single, two terminal SMD component provided with an electromagnetic screen connected to a third middle terminal of the SMD component, FIG. 4a illustrating a perspective view, FIG. 4b showing three different perpendicular cross-sectional views.
Figure 4B:
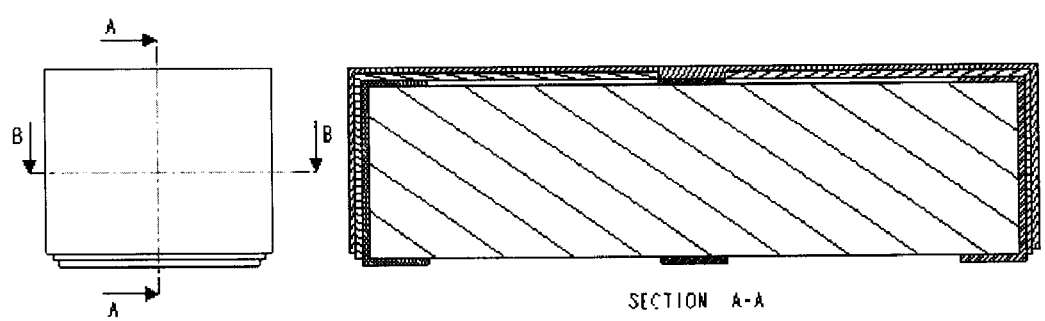
Figure 4B:
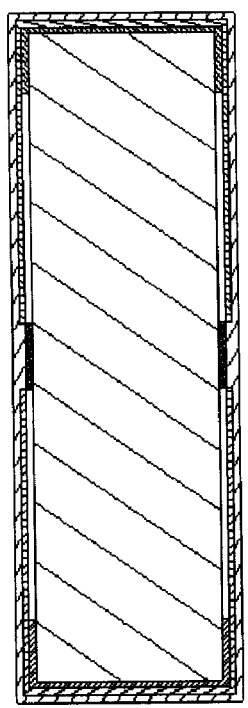

FIG. 4 shows a component assembly according to an embodiment of the invention comprising a single, two terminal SMD component provided with an electromagnetic screen connected to a third middle terminal of the SMD component, FIG. 4a illustrating a perspective view, FIG. 4b showing three different perpendicular cross-sectional views. This embodiment is equivalent to the one illustrated in FIG. 2b.

Figure 5A:
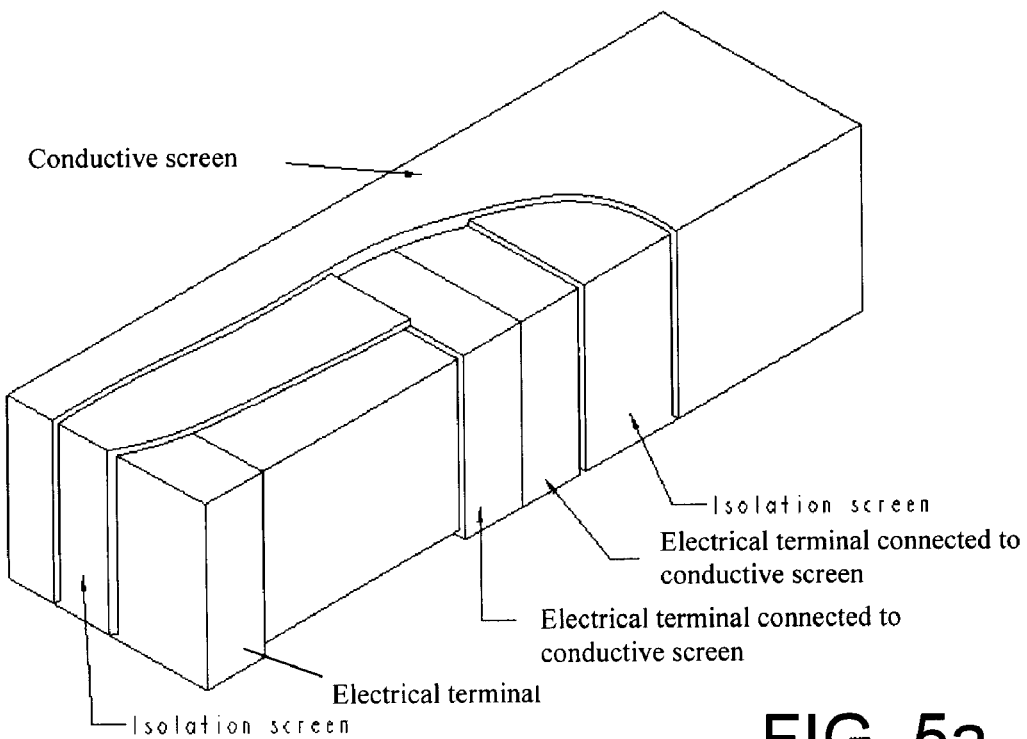
FIG. 5 shows a component assembly according to an embodiment of the invention comprising two, two terminal SMD components connected in series and provided with an electromagnetic screen connected to the common middle terminal of the serially coupled SMD components, FIG. 5a illustrating a perspective view, FIG. 5b showing three different perpendicular cross-sectional views.
Figure 5B:
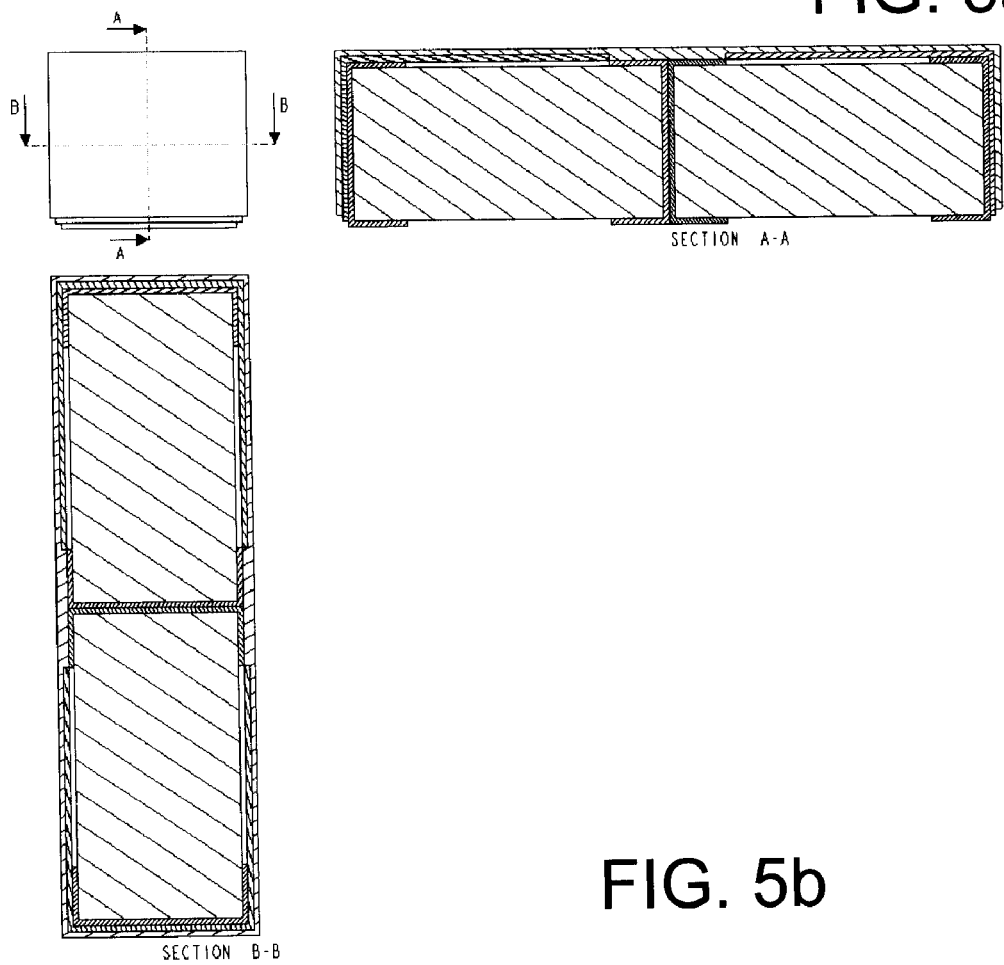

FIG. 5 shows a component assembly according to an embodiment of the invention comprising two, two terminal SMD components connected in series and provided with an electromagnetic screen connected to the common middle terminal of the serially coupled SMD components, FIG. 5a illustrating a perspective view, FIG. 5b showing three different perpendicular cross-sectional views.

Figure 6A:
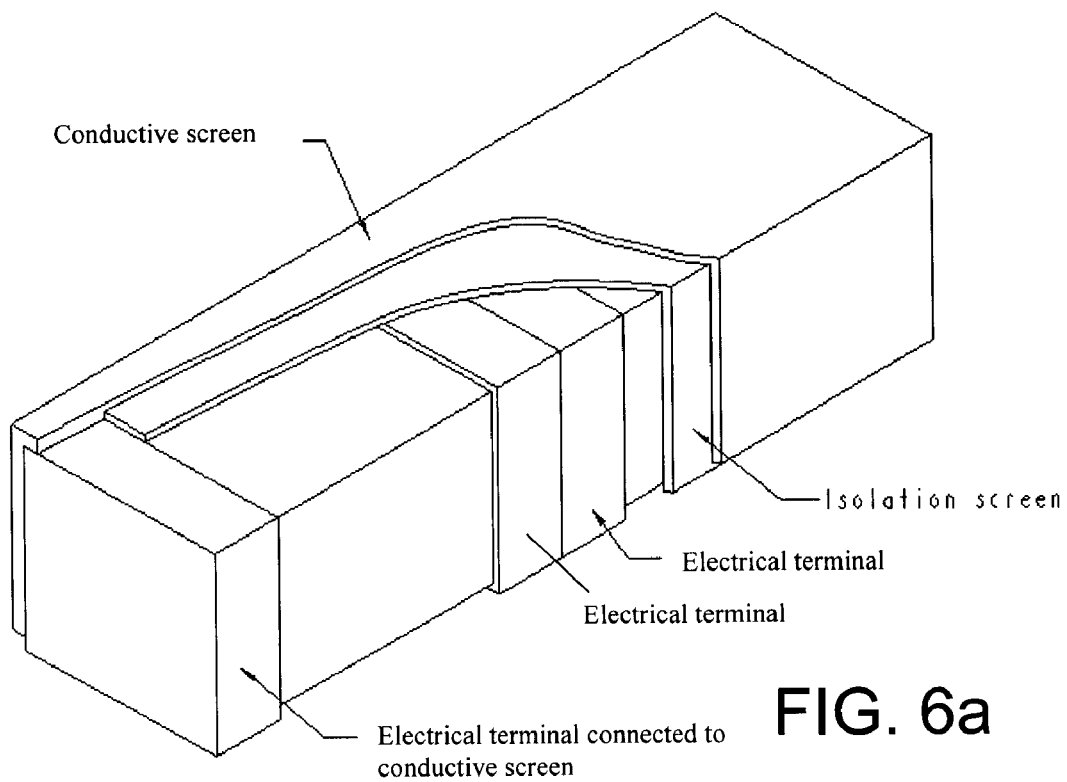
FIG. 6 shows a component assembly according to an embodiment of the invention comprising two, two terminal SMD component connected in series and provided with an electromagnetic screen connected to an end terminal of the serially coupled SMD components, FIG. 6a illustrating a perspective view, FIG. 6b showing three different perpendicular cross-sectional views.
Figure 6B:
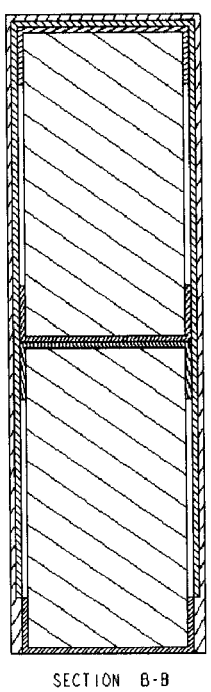
Figure 6B:
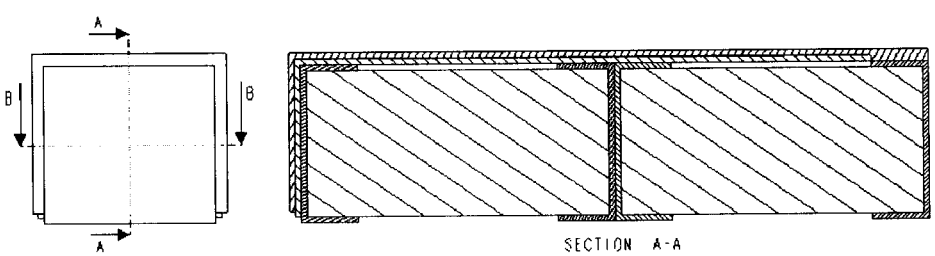

FIG. 6 shows a component assembly according to an embodiment of the invention comprising two, two terminal SMD component connected in series and provided with an electromagnetic screen connected to an end terminal of the serially coupled SMD components, FIG. 6a illustrating a perspective view, FIG. 6b showing three different perpendicular cross-sectional views. An example of such a configuration is a wireless input or output circuit wherein a reference terminal is electrically connected to one of the components. In such case, the screen is preferably connected to the reference.

Figure 7:
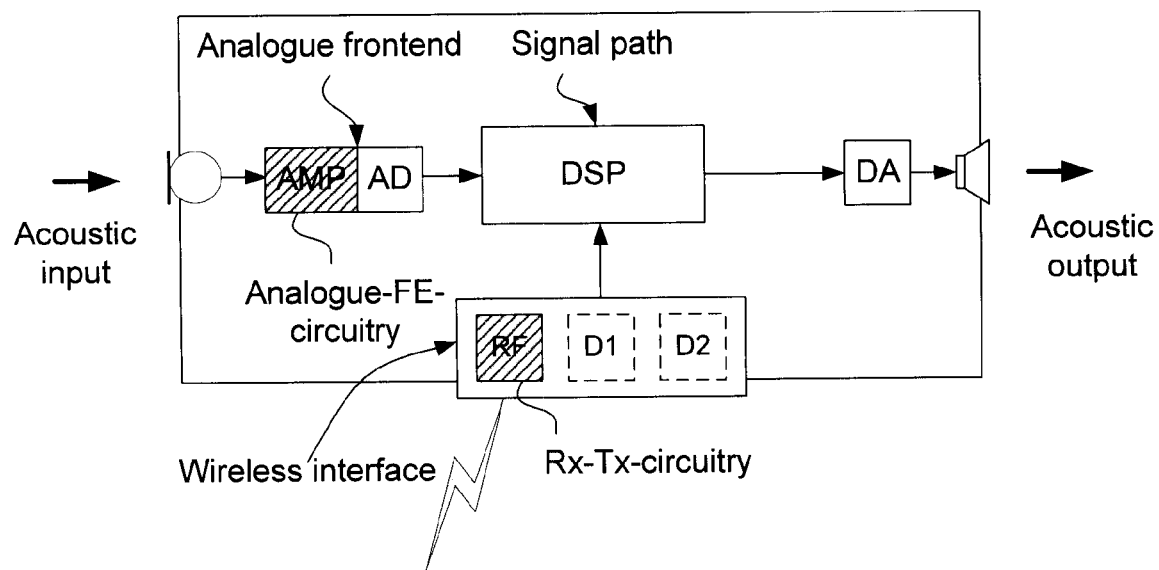
FIG. 7 shows an embodiment of a portable communications device according to the invention.

FIG. 7 shows an embodiment of a portable communications device comprising electronic component assemblies according to the disclosure. The portable communications device, e.g. a listening device, such as a hearing instrument, comprises an electrical Signal path between a microphone and a receiver. The microphone picks up an input sound signal (Acoustic input) and converts it to an analogue electrical input signal. The analogue electrical input signal is amplified and digitized in an Analogue frontend circuit comprising an amplifier (AMP) and an analogue to digital converter (AD). The signal path further comprises a digital signal processor (DSP) for processing the digitized input signal and for providing a processed output signal which can be presented to a user after being converted to an analogue signal in a digital to analogue (DA) converter and converted to an Acoustic output by the receiver. The portable communications device further comprises a Wireless interface for wirelessly communicating with another device (e.g. another hearing instrument of a system comprising a pair of hearing instruments). The Wireless interface comprises receiver and or transmitter circuitry, which can comprise analogue circuits or a combination of analogue (RF) and digital circuits (D1, D2). In the embodiment sketched in FIG. 7, two circuit parts are implemented as electronic component assemblies, here indicated by hatching (parts RF of the Wireless interface and AMP of the Analogue frontend). The RF part comprises one or more components forming part of the wireless receiver/transmitter (e.g. one or more inductors and/or capacitors and/or resistors). The AMP part comprises one or more components forming part of the Analogue frontend amplifier (e.g. one or more inductors and/ or capacitors and/or resistors). Some, such as a majority, such as all of the electronic components of the portable communications device are mounted on a common substrate comprising a footprint of electrical connections between the individual components. In addition to the AMP and RF parts, which are implemented as electronic component assemblies, some, such as a majority, such as all of the other electronic components of the portable communications device are SMD components adapted to be surface mounted on the substrate, preferably using an automated procedure. The possibility of individual electromagnetic screening of selected parts of the circuitry allows a great flexibility in placing the components on the substrate, while maintaining ease of handling (automatic mounting), inclusion of wireless technologies, and dense packaging (the latter being an important property in state of the art portable communications devices, such as mobile telephones and medical devices, e.g. hearing aids).

Figure 8:
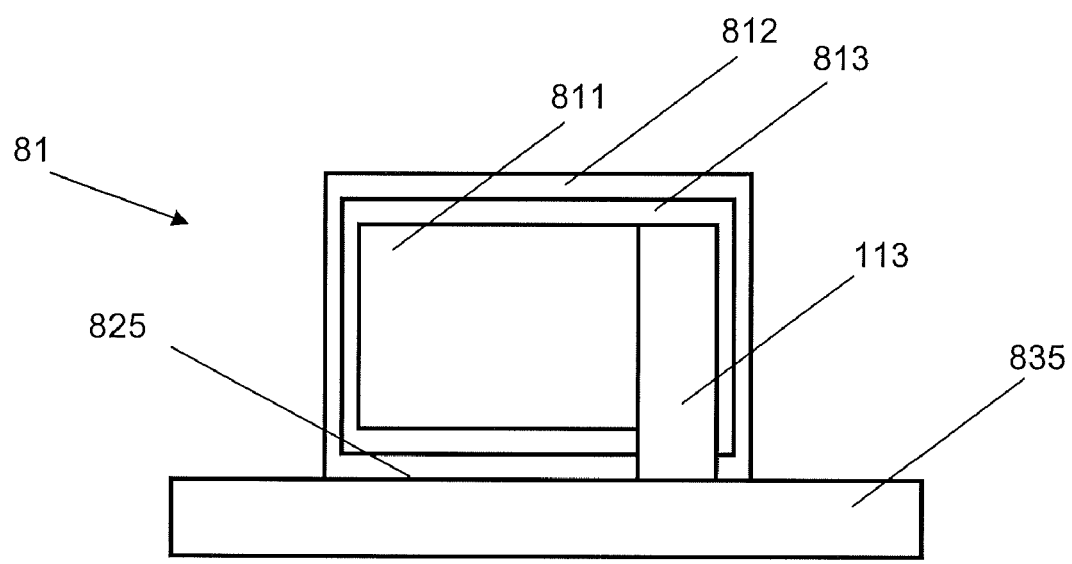
FIG. 8 shows a side view of a component assembly according to an embodiment of the invention comprising a SMD component provided with an electrically insulating layer and a electromagnetic screen that cover a part of a substrate-facing surface (e.g., such parts which do not contain electrical terminals) such that the electrically insulating layer and the electromagnetic screen are between a part of the substrate-facing surface and the substrate when the SMD component is mounted on a substrate.

FIG. 8 shows a side view of a component assembly 81 comprising a SMD component 811 provided with an electrically insulating layer 813 and a electromagnetic screen 812 that cover a part of a substrate-facing surface 825 (e.g., such parts which do not contain electrical terminals 113) such that the electrically insulating layer 813 and the electromagnetic screen 812 are between a part of the substrate-facing surface 825 and the substrate 835 when the SMD component 811 is mounted on a substrate 835.

The disclosure is defined by the features of the independent claim(s). Preferred embodiments are defined in the dependent claims. Any reference numerals in the claims are intended to be non-limiting for their scope.

Some preferred embodiments have been shown in the foregoing, but it should be stressed that the invention is not limited to these, but may be embodied in other ways within the subject-matter defined in the following claims. In the examples of electronic component assemblies according to the disclosure comprising several SMD components, these are shown to be electrically coupled in series. They might, alternatively be coupled in parallel or an assembly may comprise a combination of components coupled in series and in parallel and having at least one terminal electrically connected to a common electromagnetic screen.

The invention claimed is:

1. An electronic component assembly comprising:
   at least one surface mount device (SMD) component comprising
      a number of external surfaces limited by edges and
      at least two electrical terminals,
   an electromagnetic screen for limiting electromagnetic coupling to and from the at least one SMD component by screening electric fields, and
   an electrically insulating layer located between at least one of the surfaces and the electromagnetic screen,
   wherein the at least one SMD component has a substrate facing surface that is adapted for facing a substrate for electrical connection of a terminal of the SMD component to the substrate, and
   wherein the electrically insulating layer and, optionally, the electromagnetic screen cover a part of the substrate-facing surface such that the electrically insulating layer and, optionally, the electromagnetic screen are between a part of the substrate-facing surface and the substrate when the SMD component is mounted on a substrate.

2. The electronic component assembly according to claim 1 wherein the electrically insulating layer is applied to at least two surfaces of the SMD component or components.

3. The electronic component assembly according to claim 1 wherein the electrically insulating layer and the electromagnetic screen cover at least a part of more than one surface of the at least one SMD.

4. The electronic component assembly according to claim 1 wherein the electromagnetic screen is electrically connected to a dedicated terminal adapted for being connected to a ground reference on the substrate.

5. The electronic component assembly according to claim 1 wherein the electromagnetic screen is adapted to be soldered to an electrical terminal of the at least one SMD component.

6. The electronic component assembly according to claim 1 wherein the electrically insulating layer and the electromagnetic screen are integral with the at least one SMD component.

7. The electronic component assembly according to claim 1 wherein the electromagnetic screen is electrically connected to one of the terminals of the at least one SMD component.

8. The electronic component assembly according to claim 1 comprising a second SMD component wherein at least one terminal on the at least one SMD component is electrically connected to a terminal on the second SMD component.

9. The electronic component assembly according to claim 1 wherein the at least one SMD component is a capacitor or a resistor or an inductor or an integrated circuit.

10. The electronic component assembly according to claim 1 wherein the assembly contains only one SMD component.

11. The electronic component assembly according to claim 10 wherein the only one SMD component is a two-terminal component.

12. The electronic component assembly according to claim 1 wherein the assembly comprises only one physical item.

13. The electronic component assembly according to claim 1 wherein the SMD component is adapted to be mounted on a substrate.

14. The electronic component assembly according to claim 1 wherein the electromagnetic screen is adapted to be only connected to the substrate via its electrical connection to one or more electrical terminals of the at least one SMD component.

15. The electronic component assembly according to claim 1 wherein the electromagnetic screen is adapted to be connected to the substrate only via one or more separate electrical connections instead of via any of the electrical terminals of the at least one SMD component.

16. A portable communications device comprising an electronic component assembly according to claim 1.

17. The electronic component assembly according to claim 1 wherein the electrically insulating layer and, optionally, the electromagnetic screen cover a part of the substrate-facing surface which does not contain electrical terminals.

18. An electronic component assembly comprising:
a surface mount device (SMD) component comprising a number of external surfaces limited by edges and at least two electrical terminals,
an electromagnetic screen for limiting the electromagnetic coupling to and from the SMD component by screening electric fields,
an electrically insulating layer located between at least one of the surfaces and the electromagnetic screen, and
the electronic component assembly constituting one physical item, wherein the SMD component is adapted to be mounted on a substrate, and the assembly does not include the substrate,
wherein the at least one SMD component has a substrate facing surface that is adapted for facing a substrate for electrical connection of a terminal of the SMD component to the substrate,
wherein the electrically insulating layer and, optionally, the electromagnetic screen cover a part of the substrate-facing surface such that the electrically insulating layer and, optionally, the electromagnetic screen are between a part of the substrate-facing surface and the substrate when the SMD component is mounted on a substrate.

19. An intermediate product comprising an electronic component assembly comprising:
at least one surface mount device (SMD) component comprising
a number of external surfaces limited by edges and
at least two electrical terminals,
an electromagnetic screen for limiting electromagnetic coupling to and from the at least one SMD component by screening electric fields,
an electrically insulating layer located between at least one of the surfaces and the electromagnetic screen, and
a substrate whereon at least the electronic component assembly is mounted,
wherein the at least one SMD component has a substrate facing surface that is adapted for facing the substrate for electrical connection of a terminal of the SMD component to the substrate, and
wherein the electrically insulating layer and, optionally, the electromagnetic screen cover a part of the substrate-facing surface such that the electrically insulating layer and, optionally, the electromagnetic screen are between a part of the substrate-facing surface and the substrate when the SMD component is mounted on a substrate.

20. The intermediate product according to claim 19 wherein the substrate comprises electric connections between the electronic component assembly and at least one other electronic component or component assembly.

21. The intermediate product according to claim 19 wherein the substrate is a PCB or a ceramic substrate.

22. The intermediate product according to claim 19 wherein the electromagnetic screen is not directly electrically connected to the substrate, and is only electrically connected to the substrate via a terminal or terminals of the assembly, which the electromagnetic screen is connected to.

23. The intermediate product according to claim 19 wherein the electromagnetic screen is connected to the substrate via a separate electrical connection.

24. The intermediate product according to claim 23, wherein, in addition to the separate electrical connection to the substrate, the electromagnetic screen is connected to the substrate via an electrical connection to one or more electrical terminals of the SMD component or components of the assembly.

25. The intermediate product according to claim 19 wherein the substrate comprises a separate ground reference plane to which the electromagnetic screen is electrically connected.

* * * * *